(12) United States Patent
Boudreau et al.

(10) Patent No.: US 10,060,952 B2
(45) Date of Patent: Aug. 28, 2018

(54) SELF-SHIELDED DI/DT TRANSFORMER FOR A METER

(71) Applicant: Landis+Gyr LLC, Lafayette, IN (US)

(72) Inventors: Frank J. Boudreau, Otterbein, IN (US); Matthew E. Kraus, Jamestown, IN (US)

(73) Assignee: Landis+Gyr LLC, Lafayette, IN (US)

( * ) Notice: Subject to any disclaimer, the term of this patent is extended or adjusted under 35 U.S.C. 154(b) by 8 days.

(21) Appl. No.: 15/484,952

(22) Filed: Apr. 11, 2017

(65) Prior Publication Data

US 2017/0219633 A1 Aug. 3, 2017

Related U.S. Application Data

(63) Continuation of application No. 14/274,144, filed on May 9, 2014, now Pat. No. 9,618,542.

(60) Provisional application No. 61/821,503, filed on May 9, 2013.

(51) Int. Cl.
*G01R 15/18* (2006.01)

(52) U.S. Cl.
CPC .......... *G01R 15/185* (2013.01); *G01R 15/181* (2013.01)

(58) Field of Classification Search
CPC ............................ G01R 15/181; G01R 15/185
See application file for complete search history.

(56) References Cited

U.S. PATENT DOCUMENTS

| 4,255,704 | A | 3/1981 | Milkovic | |
|---|---|---|---|---|
| 4,847,554 | A * | 7/1989 | Goodwin | G01R 15/185 324/119 |
| 5,933,004 | A | 8/1999 | Jackson | |
| 6,121,158 | A | 9/2000 | Benchikha | |
| 6,374,188 | B1 | 4/2002 | Hubbard | |
| 6,414,475 | B1 * | 7/2002 | Dames | G01R 15/18 324/127 |
| 6,522,517 | B1 | 2/2003 | Edel | |
| 6,564,159 | B1 | 5/2003 | Lavoie | |
| 2004/0183522 | A1 * | 9/2004 | Gunn | G01R 15/185 324/126 |
| 2008/0106253 | A1 | 5/2008 | Kojovic | |
| 2013/0002512 | A1 * | 1/2013 | Leighton | H01Q 7/08 343/867 |
| 2014/0285180 | A1 | 9/2014 | Foote | |

* cited by examiner

*Primary Examiner* — Son Le
*Assistant Examiner* — Akm Zakaria
(74) *Attorney, Agent, or Firm* — Maginot, Moore & Beck LLP

(57) ABSTRACT

A sensor includes a core, first and second windings, an integrating amplifier circuit and a DC stabilization circuit. The first and second windings are wrapped around the core. The integrating amplifier circuit has a first input coupled to receive a sensed current from the first winding, and an output operably coupled to provide a current the second winding. The integrating amplifier circuit is configured to generate a phase shift from an input current received at the first input and the current provided to the second winding. The DC stabilization circuit includes a first resistive path coupled between the output of the integrating amplifier circuit and the first input of the integrating amplifier circuit, and a second resistive path coupled between the first winding and the first input of the integrating amplifier circuit.

20 Claims, 3 Drawing Sheets

SELF-SHIELDED DI/DT TRANSFORMER FOR A METER

This application is a continuation of U.S. patent application Ser. No. 14/274,144, filed May 9, 2014, which claims the benefit of U.S. Provisional Patent Application Ser. No. 61/821,503, filed May 9, 2013, both of which are incorporated herein by reference.

FIELD OF THE INVENTION

The present invention relates generally to electricity measurements, and more particularly, to current measurements such as those carried out in an electricity meter.

BACKGROUND

One of the goals of electricity metering is to accurately measure the use or consumption of electrical energy resources. With such measurements, the cost of generating and delivering electricity may be allocated among consumers in relatively logical manner. Another goal of electricity metering is help identify electrical energy generation and delivery needs. For example, cumulative electricity consumption measurements for a service area can help determine the appropriate sizing of transformers and other equipment.

Electricity metering often involves the measurement of consumed power or energy in the form of watts or watt-hours. To this end, meters include voltage sensors and current sensors that detect, respectively, the voltage and current delivered to the load. In most cases, the purpose of the voltage sensor is to provide a measurement signal that represents a scaled version of the voltage waveform delivered to the load. Similarly, a current sensor provides a measurement signal that represents a scaled version of the current waveform delivered to the load.

The current measurement in a utility meter can be challenging because a high accuracy is required, and common current sensor technologies can be susceptible to various sources of error. Present metering technologies involve current transformers, or CTs. Existing CT designs are prone to saturation and may distort causing error especially in a DC magnetic field or with a half wave rectified load. To compensate for such errors, additional circuitry is often required, which increases costs. Alternatively, other costly steps must be taken to avoid errors. For example, in a CT, it is important that certain windings around the CT core have the exact same number of turns. This requirement makes the manufacture of the specialized metering CT complex and expensive.

There is a need, therefore, for a current sensor arrangement that favorably improves upon one or more of shortcomings of existing transformers, for example, by providing sufficient accuracy under various circumstances while reducing production cost.

SUMMARY OF THE INVENTION

The invention addresses the above-describe needs, as well as others, by providing a sensor that may be used in a utility meter that includes features described herein.

A first embodiment is a sensor includes a core, first and second windings, an integrating amplifier circuit and a DC stabilization circuit. The first and second windings are wrapped around the core. The integrating amplifier circuit has a first input coupled to receive a sensed current from the first winding, and an output operably coupled to provide a current the second winding. The integrating amplifier circuit is configured to generate a phase shift from an input current received at the first input and the current provided to the second winding. The DC stabilization circuit includes a first resistive path coupled between the output of the integrating amplifier circuit and the first input of the integrating amplifier circuit, and a second resistive path coupled between the first winding and the first input of the integrating amplifier circuit.

Another embodiment is a sensor that includes a non-magnetic core, first and second windings, an integrating amplifier circuit and a DC balancing circuit. The first and second windings are wound around the core. The second winding operably is coupled to influence a current in the first winding. The integrating amplifier circuit has a first input coupled to receive a sensed current from the first winding, and an output operably coupled to provide a current the second winding. The integrating amplifier circuit is configured to generate a phase shift from an input current received at the first input and the current provided to the second winding. The sense resistor is operably coupled to receive a measurement output current from the second winding and to convert the measurement output current to a measurement voltage.

Another embodiment is an arrangement for use in an electricity meter that includes a current coil configured to provide current to a load, and a sensor similar to that described above.

The above described features and advantages, as well as others, will become more readily apparent to those of ordinary skill in the art by reference to the following detailed description and accompanying drawings.

DETAILED DESCRIPTION

Figure 1:
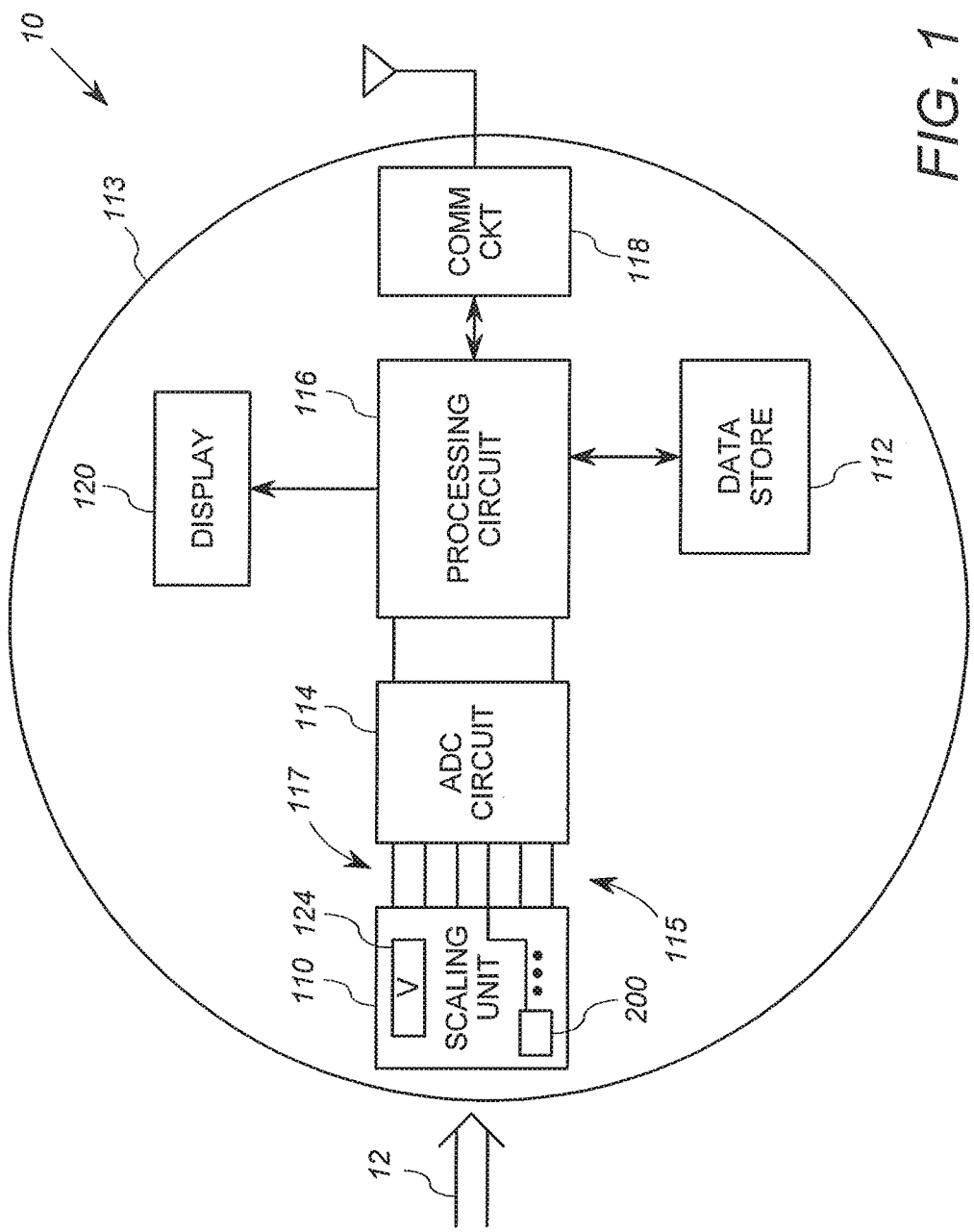
FIG. 1 shows a schematic block diagram of an exemplary meter that may be used in one or more embodiments of the present invention.

FIG. 1 shows an exemplary embodiment of a polyphase electricity meter 10 in which an arrangement according the invention is implemented. Referring to FIG. 1 specifically, the meter 10 is an apparatus for measuring energy consumption that includes a scaling circuit 110, an analog-to-digital conversion ("ADC") circuit 114, a processing circuit 116, a communication circuit 118, an optional display 120 and a data store 112. As will be discussed below, the scaling circuit 110 includes at least one current sensor 200 that operates as a self-shield di/dt sensor according to at least one embodiment of the present invention. All of the elements listed above are preferably supported by a meter housing 113, which may take a plurality of known forms. The communication circuit 118, which is also optional, may be disposed within an interior of the meter housing 113 like the other devices, or may be affixed to the outside of the meter housing 113.

In the embodiment described herein, the scaling circuit 110 and the ADC circuit 114 are collectively arranged to generate digital signals representative of line voltage waveforms $V_A$, $V_B$, $V_C$ for each of three phases A, B, C of a four-wire delta electrical system and other digital signals representative of at least three of the four line current waveforms $I_A$, $I_B$, $I_C$ and $I_N$ of the four-wire delta electrical system. It will be appreciated, however, the meter 10 may readily be configured for a three-wire delta electrical service, as well as other types of electrical service, and still employ the inventive current sensor circuitry disclosed herein. In any event, the digital signals are typically sequences of digital samples representative of an instantaneous voltage or current measurement on one phase with respect to either neutral or another phase. Circuits capable of generating such signals are known in the art.

The processing circuit 116 is configured to calculate one or more energy consumption values based on the digital signals. The energy consumption values may be communicated to a remote device using the communication circuit 118, displayed using the display 120, stored in the data store 112, or preferably some combination of the foregoing. In accordance with the embodiments described herein, the processing circuit 116 is further operable to perform any or all of the energy consumption related calculations typical for an electricity meter.

In a further detailed description of the meter 10 of FIG. 1, the scaling circuit 110 comprises one or more current sensors 200 and voltage sensors 124. The voltage sensors 124, which may, for example, include voltage dividers, generate a scaled down version of the voltage waveform present on phases of the power lines 12. The current sensors 200 are circuits and elements that generate a voltage or current signal that is a scaled down version of the current waveform present on the phases of the power lines 12. In accordance with at least one embodiment of the present invention, each of the current sensors 200, one for each phase A, B and C, may have the structure shown in FIG. 2.

The ADC circuit 114 includes one or more analog-to-digital converters that convert the scaled measurement signals into digital voltage and current measurement signals. Many circuits capable of generating digital voltage and circuit waveform signals are well known in the art. Suitable examples of analog to digital conversion circuits having such capabilities are described in U.S. Pat. No. 6,374,188; U.S. Pat. No. 6,564,159; U.S. Pat. No. 6,121,158 and U.S. Pat. No. 5,933,004, all of which are incorporated herein by reference. Moreover, the ADC circuit 114 may readily be a part of an integrated metering chip package, as will be discussed below.

The processing circuit 116 is a device that employs one or more processing devices such as microprocessors, microcontrollers, digital signal processors, discrete digital circuits and/or combinations thereof. As mentioned above, the processing circuit 116 is operable to generate energy consumption data based on the digital signals. In one example, the processing circuit 116 generates watt-hour information based on an accumulation of products of contemporaneous voltage and current samples. For example, true watt-hours for a particular phase may be calculated as the vector product of the current waveform and the voltage waveform. This vector product may be carried out with sampled voltage ($V_n$) and sampled current ($I_n$) by the formula:

$$Whrs = \Sigma V_n * I_n \quad (3)$$

where Whrs is an accumulated energy value (i.e. watt-hours) for a time frame from a starting time $n_0$ to a time corresponding to n.

Various processing circuits operable to generate energy consumption data from digital voltage and digital current measurement signals are well known in the art. Suitable examples of such circuits are described in U.S. Pat. No. 6,374,188; U.S. Pat. No. 6,564,159; U.S. Pat. No. 6,121,158 and U.S. Pat. No. 5,933,004. However, in one preferred embodiment, the processing circuit is (or includes) a processing element of a metering integrated circuit chip such as the Teridian 71M6533 measurement chip (available from Maxim). In that embodiment, both the ADC circuit 114 and the processing circuit 116 are disposed within the same semiconductor package.

The processing circuit 116 is further operable to store the plurality of energy consumption values in the data store 112. In some embodiments, the processing circuit 116 may store energy consumption values for each of plurality of time periods, in order to allow analysis of energy usage at different times of day, days of the week or month, or even seasonally. The storage of consumption indexed to time periods is often referred to in the industry as "load profiling". The data store 112 may suitably be a random access memory, EEPROM, other memory, or a combination of several types of memory. In still other embodiments, the data store 112 may include a circular buffer, FIFO device, or other memory that stores data in the order in which it is received. Other known methods may be used. In at least some embodiments, the data store 112 includes memory located within the integrated chip package that houses the processing circuit 116. The data store 112 also includes a software program that is executed by the processing circuit 116 to perform the operations of the processing circuit 116 described herein.

The communication circuit 118 is a device that is in some embodiments configured to communicate data between the metering unit 12 and one or more remote devices. In a system such as that shown in FIG. 1, the communication circuit 118 would be operable to communicate directly or indirectly with a data collection system of a utility service provider. Several of such systems are known. The utility service provider then uses the collected data to generate billing information and/or data forecasting information as is known in the art. To this end, the communication circuit 118 may suitably include a radio, a telephone modem, a power line carrier modem, or other known communication device configured for use with utility meters. Radios may be used that operate in the 100 MHz to 1 GHz range. However, other devices may operate in the kHz or low MHZ range.

In addition or in the alternative, the communication circuit 118 is configured to communicate with a locally coupled device, such as a portable computing device. The communication circuit 118 may include an optical or electrical data port, not shown, for this purpose.

The meter display 120, which is optional, may be a digital display such as a liquid crystal display. It will be appreciated that the exact nature of the display is not particularly important to the implementation of the invention. Nevertheless, there is an advantage of including at least some display capabilities. LCD displays, moreover, have been found to have a particularly advantageous set of qualities for use in electronic meters.

Figure 2:
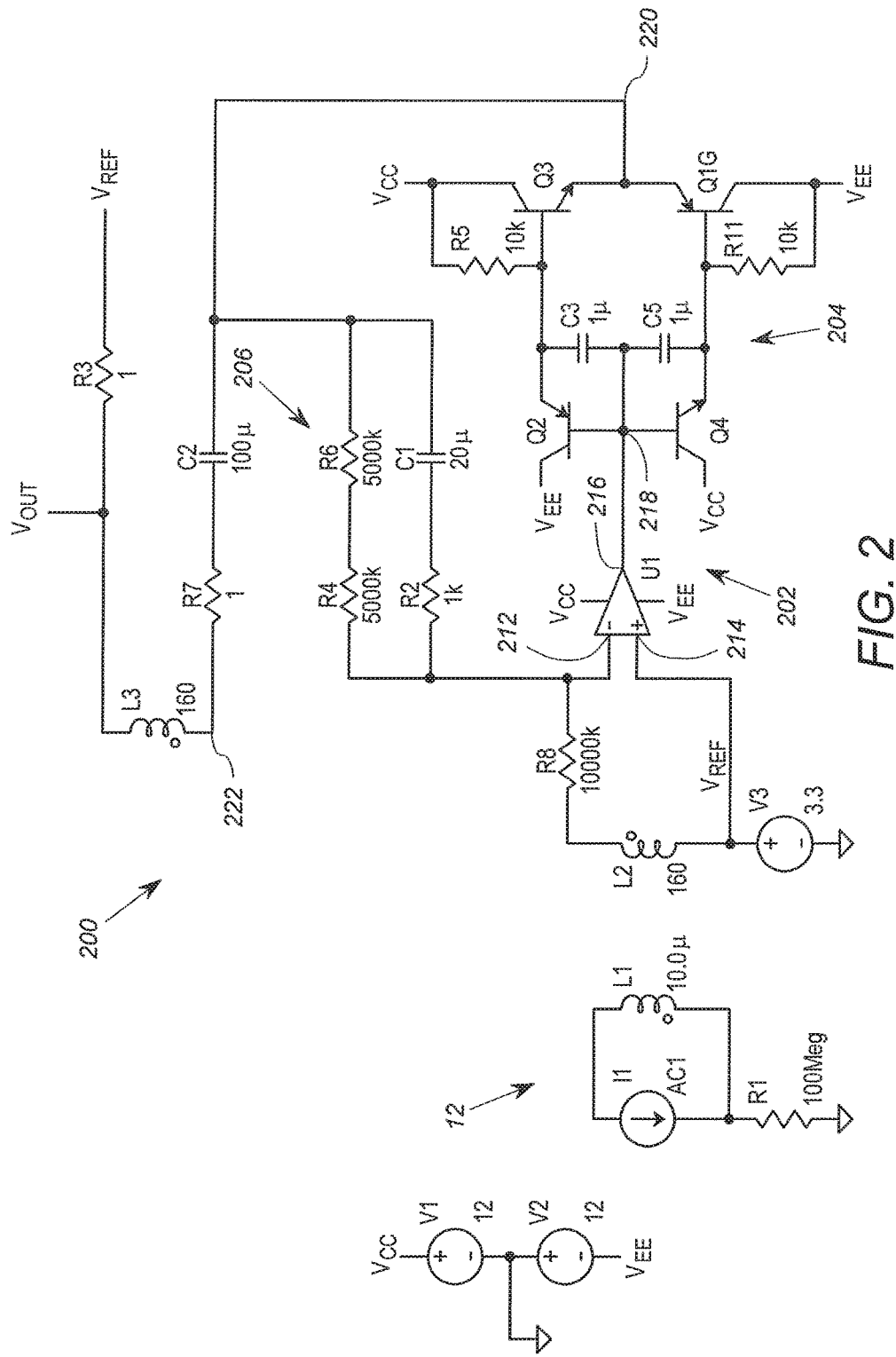
FIG. 2 shows a schematic block diagram of an exemplary current sensor according to a first embodiment of the invention that may be used in the meter of FIG. 1.

FIG. 2 shows a schematic diagram of a current sensor 200 according to the invention as well as a black-box representation (i.e. equivalent circuit) of a single phase of a power line 12. The power line 12 equivalent circuit is represented herein as a current source I1, a high impedance to ground resistor R1, and a coil L1. The coil L1 represents a current coil normally found in a utility meter that carries all (or a large proportion) of the current delivered to a customer load on the power line 12.

In this embodiment, the current sensor includes a first secondary winding L2, a second secondary winding L3, both of which are wrapped around a core, not shown on FIG. 2. The core may be permeability of greater than 1, as in an iron-based core, or could have permeability of approximately 1, such as in a Rogowski coil. In general, the windings L1, L2 and L3 are arranged in a transformer type arrangement. To this end, the windings L2 and L3 may cooperate with a suitable core to form a toroid (wrapped around a toroidal core) through which the first winding, often a single turn winding, passes. However, the transformer arrangement may take other forms.

Figure 3:
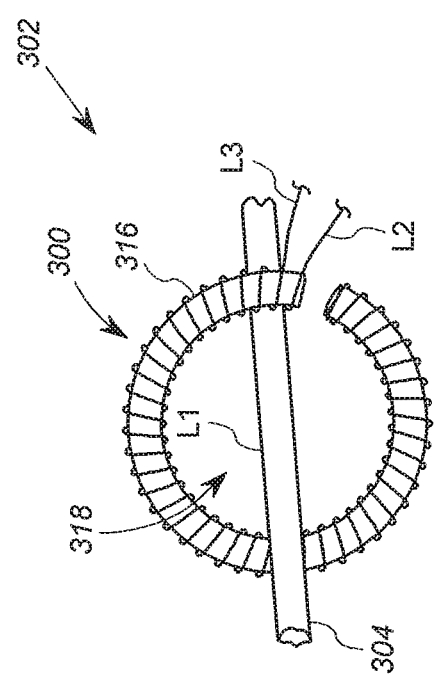
FIG. 3 shows an exemplary embodiment of a coil that may be used in the current sensor of FIG. 2.

By way of example, FIG. 3 shows a representative diagram of the windings L1, L2 and L3 arranged as a transformer 302 for sensing current on the power line 12. In this embodiment, the windings L2 and L3 are arranged as a Rogowski coil 300 that may be used in a first embodiment of the arrangement of FIG. 2. The winding L1 is arranged as a meter current coil 304. The meter current coil 304 is a conductive bar or other conductive element that carries the load current of the power line 12. The Rogowski coil 300 and the current coil 304 collectively form the transformer 302 having the windings L1, L2 and L3 of FIG. 3. In this embodiment, the Rogowski coil 300 forms part of the sensor 200 of FIG. 2.

More specifically, the Rogowski coil 300 includes a non-magnetic core 316 around which is wrapped the bifilar windings L2 and L3. The core 316 may take any suitable form but preferably has a central opening 318 through which the current coil 304 passes, such that the windings L2, L3 substantially surround the current coil 304. The current coil 304 forms the primary winding L1 of the transformer 302, and the windings L2, L3 of the Rogowski coil 300 form the secondary windings of the transformer 302. It will be appreciated that the geometry of the current coil 304 and the Rogowski coil 300 may take other suitable physical forms in the transformer 302 for current sensing purposes. As discussed above, some embodiments of the transformer 302 may even employ a current coil having a magnetic core in lieu of the non-magnetic core 316 of the Rogowski coil 300.

Referring again to FIG. 2, the sensor 200 also includes an integrating amplifier circuit 202, a current buffer 204 and a DC stabilization circuit 206. In this embodiment, the sensor 202 includes a sense resistor R3 to allow the output current measurement signal Vout to be a voltage waveform readily detectable by standard voltage-sensing A/D converters, such as the A/D converter 114 of FIG. 1.

As discussed above, the sensor 200 in one embodiment features a single core, for example, the core 316 of FIG. 3, which is wound with the windings L2, L3. The single core preferably has an opening (e.g. it is a toroidal core) through which the primary conductor L1, which is loaded with current to be measured, passes. (See, e.g. FIG. 2). It will be appreciated that while the core may be anything from air to a high permeability material, a higher permeability provides greater sensitivity.

The secondary winding L2 comprises the di/dt sense winding of the sensor 200, and may suitably have a turns ratio of 100-2000 with respect to the primary winding. The secondary winding L3 forms the ratio winding of the device, and may suitably have a turns ratio of 400 to 4000, or another value. In general, the turns ratio of the winding L3 depends on the range of the ADC circuit 114 and the upper range of the input current. In other words, the turns ratio of the secondary winding L3 should be such that it reduces the highest expected input current, plus 20%, to a level at which the output voltage Vout is within the range of the ADC circuit 114.

The integrating amplifier circuit 202 in this embodiment includes an operational amplifier U1 having an integrating feedback path. In this embodiment the integrating feedback path includes a capacitor C1 and a serially connected resistor R2. The integrating amplifier circuit 202 is configured to provide a 90° phase shift from input to output, and may take other suitable forms in other embodiments. To this end, the operational amplifier U1 includes the inverting input 212, a non-inverting input 214, and an output 216. The output 216 is coupled via the buffer 204 to the integrating feedback path C1, R2. More specifically, the output 216 is coupled to provide the amplifier output signal to an input of the current buffer 204. The current buffer 204 is configured to provide current buffering to the amplifier output signal to generate a buffered output current. The output 220 of the current buffer 204 is operably coupled to provide a buffered output current to the integrating feedback path C1, R2. The feedback path C1, R2 generates a feedback signal from the buffered output signal, and is operably coupled to provide the feedback signal to the inverting input 212 of the operational amplifier U1. Thus, in this embodiment, the current buffer 204 is coupled in series between the output 216 of the operational amplifier U1 and the serially connected capacitor C1 and resistor R1.

In general, the op-amp U1 is configured to sense the di/dt voltages off of the winding L2 and provide a drive current to the winding L3 in order to force the flux in the coil to zero and cancel the voltage at its own inverting input 212.

The current buffer 204 in this embodiment is a circuit that is configured to boost the current drive capability of the low offset integrating amplifier circuit. As discussed above, the current buffer input 218 is operably coupled to receive the amplifier output signal or output current from the output 216 of the operational amplifier U1, and is operably coupled to provide the buffered output current to its output 220. The current buffer 204 in this embodiment comprises transistors Q1, Q2, Q3, Q4, capacitors C3, C5, and resistors R5, R11 configured as a low cost current buffer.

More specifically, the transistor Q2 is a PNP BJT having a base connected to the input 218, a collector coupled to a lower rail bias voltage VEE, and an emitter. The transistor Q4 is an NPN BJT having a based connected to the input 218, a collector coupled to a higher rail bias voltage VCC, and an emitter. The capacitor C3, which may suitably be 1 µF, is coupled between the input 218 and the emitter of the transistor Q2. Analogously, the capacitor C5, which may also be 1 µF, is coupled between the input 218 and the emitter of the transistor Q4. The transistor Q1 is a PNP BJT having a base coupled to the emitter of the transistor Q4, a collector coupled to the lower rail voltage VEE, and an emitter coupled to the output 220. The transistor Q3 is a NPN BJT having a base coupled to the emitter of the transistor Q2, a collector coupled to the higher rail voltage VCC, and an emitter coupled to the output 220. The resistor R5, which may suitably be a 10 kΩ resistor, is coupled from collector to base of the transistor Q3. Similarly, the resistor R11, which may also be a 10 kΩ resistor, is coupled from collector to base of the transistor Q1. It will be appreciated that other current drives may be used as the current buffer 204.

In any event, the output 220 of the current buffer 204 is operably coupled to provide the buffered output current to a first terminal 222 of ratio winding L3. As discussed above, the resistor R2 and capacitor C1 also receive the buffered output signal and generate a feedback signal therefrom to perform integration. The resistor R2 and capacitor C1 provide the feedback signal to the non-inverting input 212.

The DC stabilization circuit 206 comprises the resistors R4, R6, R8. The resistors R4, R6 are serially coupled between the output 216 of the op-amp U1 (via the current buffer 204) and the inverting input 212 of the op-amp U1. More specifically, in this embodiment, the resistors R4, R6 are coupled between the output 220 of the current buffer 204 and the inverting input 212 of the op-amp U1. Each of the resistors R4, R6 may suitably have a resistance of 5 MΩ. The resistor R8 is coupled between the di/dt winding L2 and the inverting input 212 of the op-amp 206. The resistor R8 may suitably have a resistance of 10 MΩ.

In general, the DC stabilization circuit 206 provides DC stabilization to the circuit. To this end, the DC stabilization circuit 206 provides a DC resistive path back to the inverting input 212 of the op-amp U1. Without out it, the op-amp U1 output would drive to the output rail of the op-amp U1. The resistor R8 improves DC offset to increase common mode range. In particular, with the combination of R4 and R6, there needs to be an impedance to the reference point, or the signal would be shorted by the sense winding L2. The impedance of R8 compared to the input impedance of the op-amp U1 is relatively small.

The sensor 200 also includes a DC isolation capacitor C2 coupled between the output 216 of the op-amp U1 (via the current buffer 204) and the first terminal 222 of the ratio winding L3. In this embodiment, the DC isolation capacitor C2 is couple between the output 220 and the first terminal 222. The DC isolation capacitor C2 prevents DC bias voltages from passing between the second winding L3 and the integrating amplifier circuit 202. In series with the capacitor C2 is a resistor R7 of 1Ω. The resistor R7 adjusts the output impedance to stabilize the network. In this embodiment, the resistor R3 is used as a sense resistance which effectively converts the output current, which represents the measurement current, from the winding L3 to a corresponding output voltage Vout. The sense resistor R3 may suitably be 1Ω in this embodiment. The Vout output is operably coupled to the ADC 114 of FIG. 1.

In this embodiment, the current measurement signal Vout is biased to an all-positive voltage using a voltage source V3 of 3.3 volts. The 3.3 voltage reference VREF is provided as the reference voltage connection to the winding L2, the non-inverting input of the op-amp U1, and the reference for the sense resistor R3. This biasing reference voltage allows the measurement signal, which represents that AC current waveform, to always be a positive value, even through the negative swings of the AC cycle. In other words, instead of the measurement signal ranging from −1.5V to 1.5V peak to peak, for example, the Vout signal would range from 0.1 to 3.1 volts peak to peak.

In operation, the primary current on the winding L1 induces a voltage (Vsense) on the winding L2 proportional to K di/dt, where K is a constant. "K" is a function of temperature, time, geometry, and core permeability. The voltage Vsense is sensed by the op-amp U1. The op-amp U1 will then drive a current, via the buffer 204 (i.e. the buffered output current), through the winding L3 to drive the flux of the coil to zero to reduce the difference of the voltage sensed at the inputs 212 and 214 to zero. However the current produced will be proportional to the input current (from L1) by the exact turns ratio between L1 and L3, due to the coupling of L1, L2 and L3.

The sensor 200 in normal operation will exhibit a higher accuracy over a larger dynamic range than a traditional CT, because the non-magnetic core does not have undesirable excitation currents. If, instead of a Rogowski coil, the windings L2 and L3 are wrapped around a magnetic core, then Vsense will be amplified by the core material, resulting in greater sensitivity. Such a device will be immune to AC fields unlike an embodiment employing a Rogowski coil. Moreover, because of the integrating amplifier circuit 202, the device will be immune to DC magnetic fields and DC currents unlike a traditional current transformer. Ratio accuracies better than 0.05% over the entire range are typically achievable. The current buffer 204 allows for a low driving op-amp, thereby reducing costs.

In the case where an external DC field or current causes total saturation, the device would be reduced to a sensor that is not unlike a traditional Rogowski coil. However, the invention still provides improvements (as it would if the permeability was 1): immunity to error due to shifts in inductance, due to external influences, and due to aging, and due to primary vs. coil window position.

In addition a single coil could be used with multiple primaries with no additional error like a traditional CT. Rogowski coils exhibit an imbalanced transfer function due to the mutual inductances of multiple primaries not being equal.

The above-describe embodiments provide one or more of the following advantages:
1. Immunity to near AC fields under normal operation (Core permeability>>1 only);
2. High DC Tolerance due to near magnetic fields or half wave rectified loads;
3. Higher accuracy when compared to a traditional CT or Rogowski coil;
4. Immunity to fluctuations in self/mutual inductance due to temperature, aging;
5. Low cost;
6. Immunity to saturation within common mode range of active circuit, recovers quickly if range exceeded;
7. Small and light weight;
8. Inexpensive materials;
9. Reduction in component count; and
10. Multiple primaries may be measured without imbalance, unlike a Rogowski Coil.

It will be appreciated that the embodiment of FIG. 2, or a modification thereof, may be used in a form 2S meter without measurement imbalance between the current coils, unlike a Rogowski coil which has been used in the prior art. A Rogowski coil's mutual inductance changes with the position of the primary relative to the center of the Rogowski coil which may result in imbalanced current measurements when multiple primaries are used due to the heterogeneous nature of the windings.

This invention could be used in any meter, however meters that require DC immunity and where high accuracy is required (such a 0.1% accuracy class) are ideal cases.

Some notable features include the DC stabilization circuit 206, which includes the very high impedance (e.g 5000 k-ohm) series connected feedback resistors R4 and R8, as well as the U1 input resistance R8 of 10000 k-ohm. In addition, the low-cost buffer 204 provides cost savings over more complex designs.

It will be appreciated that the above described embodiments are merely exemplary, and that those of ordinary skill in the art may readily devise their own modifications and implementations that incorporate the principles of the present invention and fall within the spirit and scope thereof.

We claim:

1. A sensor for use in metering, comprising:
   a) a core around which are wound first and second windings:
   b) an integrating amplifier circuit having a first input coupled to receive a sensed current from the first winding, and an output operably coupled to provide a current to the second winding, the integrating amplifier circuit configured to generate a phase shift from an input current received at the first input to the current provided to the second winding; and
   c) a DC stabilization circuit including a first resistive path coupled between the output of the integrating amplifier circuit and the first input of the integrating amplifier circuit, and a second resistive path coupled between the first winding and the first input of the integrating amplifier circuit.

2. The sensor of claim 1, wherein the integrating amplifier circuit includes an amplifier having the first input, and an integrating feedback path comprising a resistor and a serially connected capacitor, the integrating feedback path operably coupled to receive the current provided to the second winding, and configured to generate a feedback signal therefrom, the integrating feedback path configured to provide the feedback signal to the first input.

3. The sensor of claim 2, further comprising a current buffer operably coupled to receive an output signal from an amplifier output of the amplifier, the current buffer configured to buffer the output signal to generate the current provided to the second winding.

4. The sensor of claim 1, further comprising a sense resistor operably coupled between the second winding and a reference voltage, the sense resistor configured to generate an output voltage representative of current received from the second winding.

5. The sensor of claim 1, wherein the second winding is operably couple to influence current in the first winding.

6. The sensor of claim 1, further comprising a positive bias voltage source operably coupled to provide a positive bias voltage between the first winding and the integrating amplifier circuit, the positive bias voltage maintaining a positive voltage on the second winding at all points of an AC cycle of the sensed current.

7. The sensor of claim 1, wherein the first winding and the second winding are bifilar windings.

8. The sensor of claim 1, wherein the first resistive path and the second resistive path have a same resistance.

9. A sensor, comprising:
   a) a non-magnetic core around which are wound first and second windings, the second winding operably coupled to influence the first winding;
   b) an integrating amplifier circuit having a first input coupled to receive a sensed current from the first winding, and an output operably coupled to provide a current to the second winding, the integrating amplifier circuit configured to generate a phase shift from an input current received at the first input to the current provided to the second winding; and
   c) a sense resistor operably coupled to receive a measurement output current from the second winding and to convert the measurement output current to a measurement voltage.

10. The sensor of claim 9, wherein the integrating amplifier circuit includes an amplifier having the first input, and an integrating feedback path comprising a resistor and a capacitor, the integrating feedback path serially coupled from the output to the first input.

11. The sensor of claim 10, further comprising a buffer operably coupled to receive an output signal from the amplifier, and to provide the current to the second winding.

12. The sensor of claim 9, wherein the sense resistor is operably coupled to provide the measurement voltage to an analog-to-digital converter.

13. The sensor of claim 9, further comprising a positive bias voltage source operably coupled to provide a positive bias voltage between the first winding and the integrating amplifier circuit, the positive bias voltage maintaining a positive voltage on the second winding at all points of an AC cycle of the sensed current.

14. The sensor of claim 9, wherein the first winding and the second winding are bifilar windings.

15. An arrangement for use in an electricity meter, comprising:
   a) a current coil configured to provide current from a utility power line to a load;
   b) a core around which are wound first and second windings, the second winding operably coupled to influence the first winding, wherein the current coil, the core and at least one of the first and second windings form a transformer;
   c) an integrating amplifier circuit having a first input coupled to receive a sensed current from the first winding, and an output operably coupled to provide a current to the second winding, the integrating amplifier circuit including an integrating feedback path coupled to receive the current and generate a feedback signal therefrom, the integrating feedback path configured to provide the feedback signal to the first input; and
   d) a sense resistor operably coupled to receive a measurement output current from the second winding and to convert the measurement output current to a measurement voltage.

16. The arrangement of claim 15, wherein the core includes a central opening, and wherein the current coil passes through the central opening.

17. The arrangement of claim 16, wherein the core is non-magnetic.

18. The arrangement of claim 17, wherein the first and second windings are bifilar windings.

19. The arrangement of claim 18, further comprising an analog-to-digital converter operably coupled to receive the measurement voltage from the sense resistor.

20. The arrangement of claim 19, further comprising a DC isolation capacitor operably coupled to block DC voltage propagation between the second winding and the output of the integrating amplifier circuit.

* * * * *